(12) United States Patent
Bilgic et al.

(10) Patent No.: US 10,436,866 B2
(45) Date of Patent: Oct. 8, 2019

(54) SIMULTANEOUS MULTISLICE MRI WITH RANDOM GRADIENT ENCODING

(71) Applicant: THE GENERAL HOSPITAL CORPORATION, Boston, MA (US)

(72) Inventors: Berkin Bilgic, Boston, MA (US); Kawin Setsompop, Charlestown, MA (US); Lawrence L. Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 291 days.

(21) Appl. No.: 15/114,999

(22) PCT Filed: Jan. 30, 2015

(86) PCT No.: PCT/US2015/013674
§ 371 (c)(1),
(2) Date: Jul. 28, 2016

(87) PCT Pub. No.: WO2015/116894
PCT Pub. Date: Aug. 6, 2015

(65) Prior Publication Data
US 2016/0341807 A1 Nov. 24, 2016

Related U.S. Application Data

(60) Provisional application No. 61/933,951, filed on Jan. 31, 2014.

(51) Int. Cl.
*G01R 33/483* (2006.01)
*G01R 33/48* (2006.01)
*G01R 33/561* (2006.01)

(52) U.S. Cl.
CPC ..... *G01R 33/4835* (2013.01); *G01R 33/4822* (2013.01); *G01R 33/5611* (2013.01); *G01R 33/5616* (2013.01)

(58) Field of Classification Search
CPC ............ G01R 33/5608; G01R 33/4835; G01R 33/5611; G01R 33/4828; G01R 33/5616; G01R 33/4822
(Continued)

(56) References Cited

U.S. PATENT DOCUMENTS 4,937,526 A * 6/1990 Ehman ............... G01R 33/5676
324/306
5,099,208 A * 3/1992 Fitzpatrick ....... G01R 33/56563
324/312
(Continued)

OTHER PUBLICATIONS

Zuikova, N. V., T. V. Kondrat'eva, and V. D. Svet. "Visualization of blood flow by ultrasound speckle interferometry." Acoustical Physics 47.5 (2001): 578-584.*
(Continued)

*Primary Examiner* — Christopher P McAndrew
(74) *Attorney, Agent, or Firm* — Quarles & Brady LLP

(57) ABSTRACT

Systems and methods for simultaneous multislice ("SMS"} magnetic resonance imaging ("MRI"}, in which a random blip gradient encoding scheme is utilized to impart a different phase to each of a plurality of different slice locations. Because of the random blip gradient encoding, the amount of the imparted phase is randomized for each phase encoding step in a Cartesian k-space trajectory. This data acquisition strategy leads to incoherent aliasing artifacts across the simultaneously excited slices. Images of the individual slices can be reconstructed using a compressed sensing framework.

11 Claims, 7 Drawing Sheets

(58) Field of Classification Search
USPC .......................................................... 324/309
See application file for complete search history.

(56) References Cited

U.S. PATENT DOCUMENTS

| | | | |
|---|---|---|---|
| 5,779,636 A | 7/1998 | Kanazawa | |
| 5,781,010 A * | 7/1998 | Kawasaki | G01R 33/5673 |
| | | | 324/306 |
| 5,786,692 A * | 7/1998 | Maier | G01R 33/56341 |
| | | | 324/307 |
| 9,778,336 B2 * | 10/2017 | Polimeni | G01R 33/4835 |
| 2011/0254548 A1 * | 10/2011 | Setsompop | G01R 33/4835 |
| | | | 324/309 |
| 2012/0256628 A1 | 10/2012 | Wong | |
| 2013/0181710 A1 | 7/2013 | Setsompop et al. | |

OTHER PUBLICATIONS

Zuikova, N. V., T. V. Kondrat'eva, and V. D. Svet. "Visualization of blood flow by ultrasound speckle interferometry." Acoustical Physics 47.5 (2001): 578-584. (Year: 2001).*

Seiberlich, Nicole, et al. "Using the GRAPPA operator and the generalized sampling theorem to reconstruct undersampled non-Cartesian data." Magnetic resonance in medicine 61.3 (2009): 705-715. (Year: 2009) (Year: 2009).*

International Search Report and Written Opinion dated Apr. 15, 2015 in connection with PCT/US2015/013674.

\* cited by examiner

IMAGES FOR INDIVIDUALLY EXCITED SLICES

EFFECT OF RANDOM PHASE

COLLAPSED (SUMMED) IMAGE ial Patent Application
SIMULTANEOUS MULTISLICE MRI WITH RANDOM GRADIENT ENCODING

CROSS-REFERENCE TO RELATED APPLICATIONS

This application is a 371 application of PCT/US2015/013674 filed Jan. 30, 2015, which claims priority from and claims the benefit of the U.S. Provisional Patent Application Ser. No. 61/933,951, filed on Jan. 31, 2014, the disclosures of which are incorporated by reference herein for all purposes.

STATEMENT REGARDING FEDERALLY SPONSORED RESEARCH

This invention was made with government support under EB012107 and MH093765 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for simultaneous multislice ("SMS") imaging, in which k-space data is simultaneously acquired from multiple different slice locations.

MRI allows for the non-invasive investigation of tissues with detailed soft tissue contrast; however, it is an inherently slow imaging modality that collects data in the Fourier transform representation of the scanned object. Two-dimensional MRI involves the acquisition of multiple slices within a region-of-interest, wherein the total imaging time is proportional the number of slices that are prescribed.

SMS imaging is a technique that aims to address this shortcoming by exciting and acquiring multiple slices at once using a multichannel radio frequency ("RF") receiver array. The multiple excited slices are then separated by exploiting the information provided by the multichannel receive arrays. Each of these receivers is sensitive to a specific region in space, and the spatial difference across the sensitivity profiles of the excited slices provides the ability to distinguish the individual slices from the acquired data. As the sensitivity of the receivers across these slices become more distinct, the capability of parallel imaging algorithms to separate these collapsed data increases.

The recently proposed blipped-CAIPI technique, described in U.S. Pat. No. 8,405,395, improves the orthogonality of the receive profiles by introducing spatial shifts across the collapsed slices. This involves exciting the slices with special RF pulses that deposit alternating phase to their Fourier transform. As a phase ramp in the Fourier representation of a signal corresponds a shift in the spatial domain, these pulses effectively create inter-slice shifts that improve the reconstruction quality of SMS imaging.

It would therefore be desirable to provide a method for simultaneous, multislice imaging that significantly decreases the amount of time required for acquiring image data; that is applicable to imaging pulse sequences that sample multiple lines of k-space following each RF excitation, such as EPI sequences; and that allows more reliable separation of aliased pixels than currently available methods for simultaneous multislice imaging, so that the benefits associated with these techniques can be realized in a clinical setting.

SUMMARY OF THE INVENTION

The present invention provides a method for producing a plurality of images of a subject with a magnetic resonance imaging ("MRI") system. The MRI system is directed to perform a pulse sequence that includes applying a radio frequency ("RF") excitation field to a portion of a subject that includes a plurality of slice locations. The plurality of slice locations includes a current slice location and at least one adjacent slice location. The RF excitation field excites spins in the plurality of slice locations. The pulse sequence also includes establishing at least one readout magnetic field gradient along a frequency-encoding direction following the application of the RF excitation field, in order to form echo signals. The pulse sequence also includes sequentially producing a plurality of slice-encoding magnetic field gradient blips along a slice-encoding direction while the at least one readout magnetic field gradient is established such that the slice-encoding magnetic field gradient blips are played out between readout lines. Each sequential slice-encoding magnetic field gradient blip has a randomly assigned magnitude such that a random phase shift related to the randomly assigned magnitude is imparted to the formed echo signals. Data is then acquired by sampling the formed echo signals using an array of RF receiver coils. At least one image for each of the plurality of slice locations is then reconstructed from the acquired data.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for simultaneous multislice ("SMS") magnetic resonance imaging ("MRI"), in which a random blip gradient encoding scheme is utilized to impart a different phase to each of a plurality of different slice locations. Because of the random blip gradient encoding, the amount of the imparted phase is randomized for each phase encoding step in a Cartesian k-space trajectory. This data acquisition strategy leads to incoherent aliasing artifacts across the simultaneously excited slices.

The systems and methods of the present invention are described with reference to the following orthogonal spatial encoding directions common to MRI: a slice-encoding direction, a phase-encoding direction, and a frequency-encoding direction. As one example, the slice-encoding direction can correspond to the z-direction in the image domain, which is aligned along the longitudinal axis of the bore of an exemplary MRI system, and the $k_z$-direction in k-space. In this example, the obtained images are transverse, or axial, images lying in the x-y plane. Accordingly, in this example, the phase-encoding direction can correspond to the y-direction in the image domain, and the $k_y$-direction in k-space; and the frequency-encoding direction can correspond to the x-direction in the image domain, and the $k_x$-direction in k-space. It will be appreciated by those skilled in the art that the choice of these directions is arbitrary and any suitable permutation of these directions, or any set of orthogonal oblique directions, is possible and within the scope of the present invention. The choice of these directions is typically made depending on the desired imaging application, such as whether it is desirable to acquire axial, sagittal, or coronal images of a subject.

The systems and methods of the present invention differ from the blipped-CAIPIRINHA method described in U.S. Pat. No. 8,405,395, which is herein incorporated by reference in its entirety, in that the blipped CAIPIRINHA method utilizes a structured blip gradient scheme, whereas the systems and methods of the present invention utilize a random scheme. Thus, unlike the blipped-CAIPIRINHA method, which yields structured aliasing artifacts that can be unfolded using previous parallel imaging reconstruction techniques such as SENSE, the systems and methods of the present invention generate incoherent aliasing artifacts that require different processing to unfold.

Figure 1:
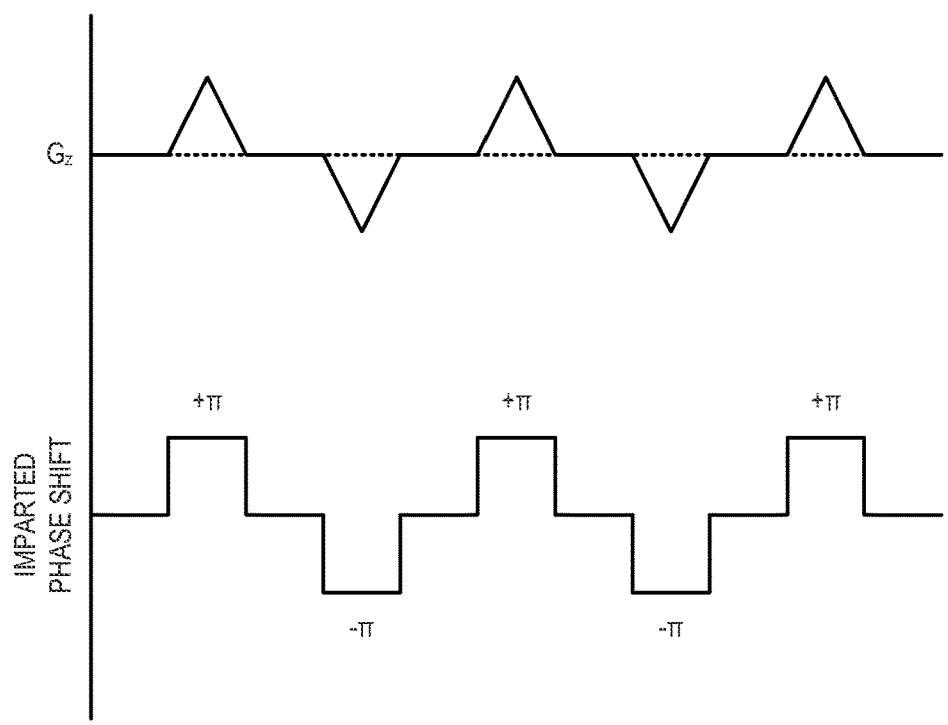
FIG. 1 is an example of a structured blipped gradient encoding scheme, in which structured aliasing artifacts are generated.
Figure 2:
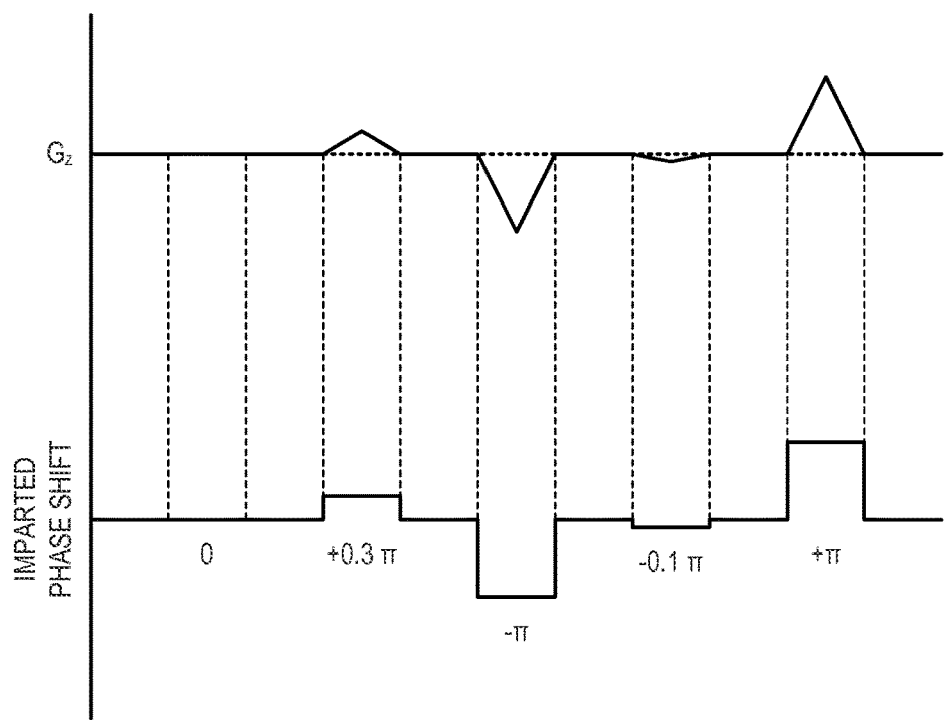
FIG. 2 is an example of a random blipped gradient encoding scheme, in which incoherent aliasing artifacts are generated.

An example of a traditional blipped-CAIPIRINHA gradient blip sequence is illustrated in FIG. 1. This gradient blip sequence imparts a structured sequence of phase shifts during the data acquisition process. In this example, those phase shifts are $\{+\pi,-\pi,+\pi C,-\pi,+\pi \ldots\}$. An example of a gradient blip sequence in which the gradient blips are assigned a random magnitude, such that a random phase shift is imparted to acquired data, is illustrated in FIG. 2. In this example, those phase shifts are $\{0,+0.3\pi,-\pi,-0.1\pi,+\pi, \ldots\}$. A gradient blip sequence such as this, in which sequentially random phase shifts are imparted to the acquired data, will result in incoherent aliasing rather than structured aliasing. As will now be described, this incoherent aliasing facilitates the use of an image reconstruction framework that accounts for such incoherency.

The recently developed signal processing technique referred to as compressed sensing ("CS") facilitates reconstruction of signals from an incomplete Fourier representation, provided that certain conditions are met. This technique is capable of allowing the acceleration of MRI by collecting less data than conventionally required, thereby reducing the scan time. One condition that allows successful CS recovery is that the signal should be compactly represented under a mathematical transform. Another such condition is that the Fourier representation of the signal should be sampled so that the aliasing artifacts under this transform are incoherent. Still another condition is that a nonlinear signal processing algorithm should be applied to enforce a compact representation while preserving the acquired data.

Because CS reconstructions favor incoherence between the data encoding process and the signal transformation process, which compactly represents the slices, the proposed acquisition scheme facilitates CS reconstruction of the collapsed data.

In some embodiments, the compressed sensing framework utilized to reconstruct images from the acquired data makes use of a forward model that includes the random phase applied on the slices. As an example, a total variation ("TV") regularization can be used in this compressed sensing framework. As another example, a wavelet transformation-based regularization can be implemented. In some embodiments where date is acquired using a multichannel receiver, the forward model may also include coil sensitivity profiles. In these embodiments, the forward model may include a generalized SENSE framework to which additional constraints, such as the TV regularization or wavelet transform-based regularization, can be added.

In some embodiments, such as those that use a TV regularization, parallel imaging techniques can be synergistically combined with compressed sensing. As an example, a parallel imaging methodology that utilizes the spatial encoding provided by the multichannel receive arrays can be incorporated into the compressed sensing framework to further exploit the compact representation under a suitable signal transformation (e.g., wavelet or total variation) to separate the excited slices.

Figure 3:
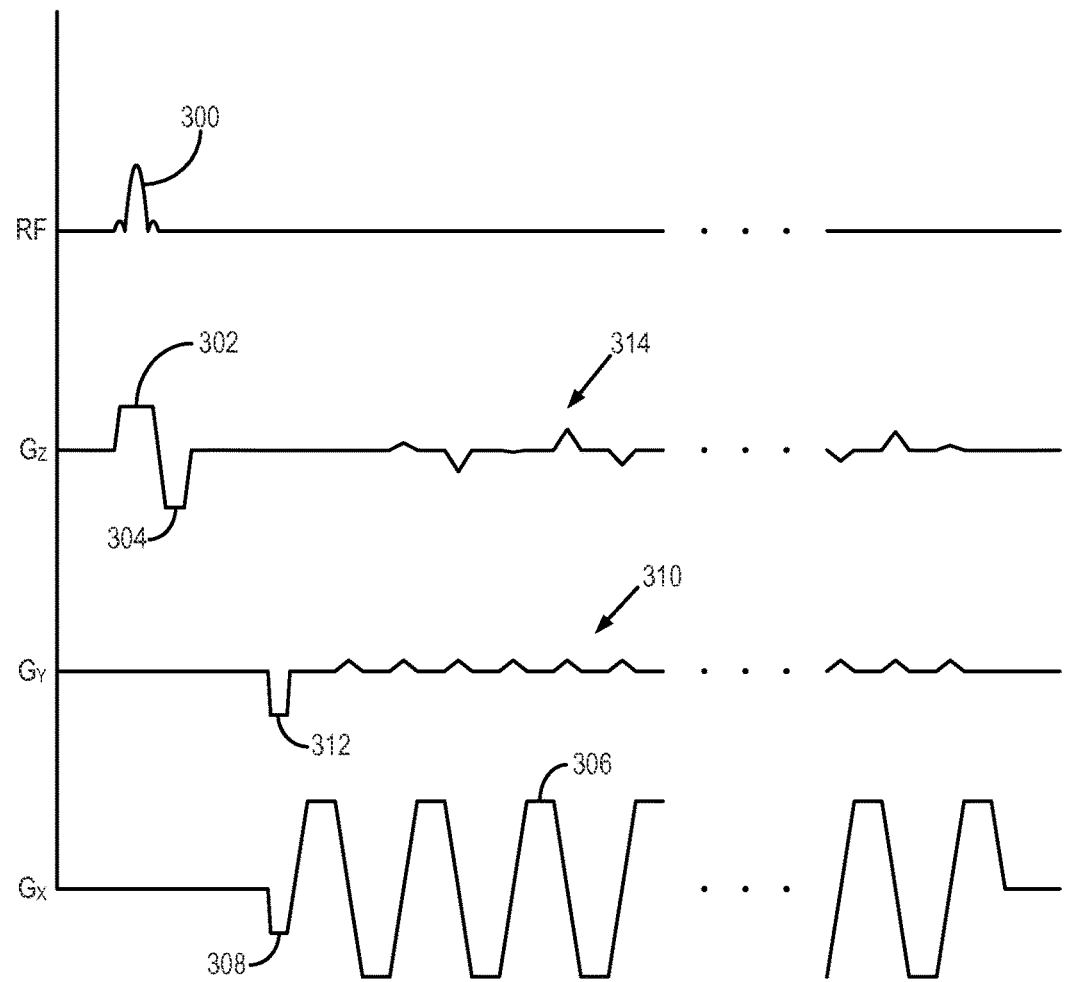
FIG. 3 is a graphic illustration of an exemplary gradient-recalled echo planar imaging ("EPI") pulse sequence for directing a magnetic resonance imaging ("MRI") system to simultaneously acquire image data from multiple slice locations in a subject, such that a random phase shift is imparted to MR signals acquired from slice locations adjacent a desired slice location.

An example of a pulse sequence implemented by the MRI system to acquire image data in accordance with some embodiments of the present invention is illustrated in FIG. 3. In this example, the pulse sequence is a gradient-recalled echo planar imaging ("EPI") pulse sequence that is modified to simultaneously acquire data from multiple slice locations.

The pulse sequence includes a spatially selective radio frequency ("RF") excitation pulse 300 that is played out in the presence of a slice-selective gradient 302 in order to produce transverse magnetization in a plurality of prescribed imaging slices. For example, three slice locations each separated by 4.2 centimeters ("cm") are selectively excited. The RF excitation pulse 300 is the summation of RF excitation pulses that would be used to separately excite the desired plurality of slice locations. In some embodiments, the flip angle of the RF excitation pulse 300 may be less than 90 degrees. As one example, the flip angle may be 70 degrees. The slice-selective gradient 302 includes a rephasing lobe 304 that acts to rephase unwanted phase dispersions introduced by the slice-selective gradient 302 such that signal losses resultant from these phase dispersions are mitigated.

Following excitation of the nuclear spins in the prescribed imaging slices, image data is acquired by sampling a series of gradient-recalled echo signals in the presence of an alternating readout gradient 306. The alternating readout gradient is preceded by the application of a pre-winding gradient 308 that acts to move the first sampling point along the frequency-encoding, or readout, direction by a distance $\Delta k_x$ in k-space. Spatial encoding of the echo signals along a phase-encoding direction is performed by a series of phase encoding gradient "blips" 310, which are each played out in between the successive signals readouts such that each echo signal is separately phase encoded. The phase encoding gradient blips 310 are preceded by the application of a pre-winding gradient 312 that acts to move the first sampling point along the phase-encoding direction a distance $\Delta k_y$ in k-space. Together, the pre-winding gradients 308 and 312 serve to begin the sampling of k-space at a defined k-space location $(k_x,k_y)$.

During the application of each phase encoding gradient blip 310, a magnetic field gradient blip 314 is also played out along the slice-encoding direction. These slice encoding gradient blips 314 act to impart a random phase variation along the phase encoding direction for each slice location. This mix of random phase shifts results in the incoherent aliasing pattern mentioned above. The amount of phase shift imparted to each slice location is related to the magnitude of the gradient blip 314. As described above, the magnitude of these gradient blips 314 are sequentially randomly assigned, such that a random phase is imparted to echo signals as data is being acquired. As is known in the art, the foregoing pulse sequence is repeated a plurality of times with a different slice-selective gradient 302 being applied in each repetition such that multiple sets of a plurality of slice locations are sampled.

Figure 4:
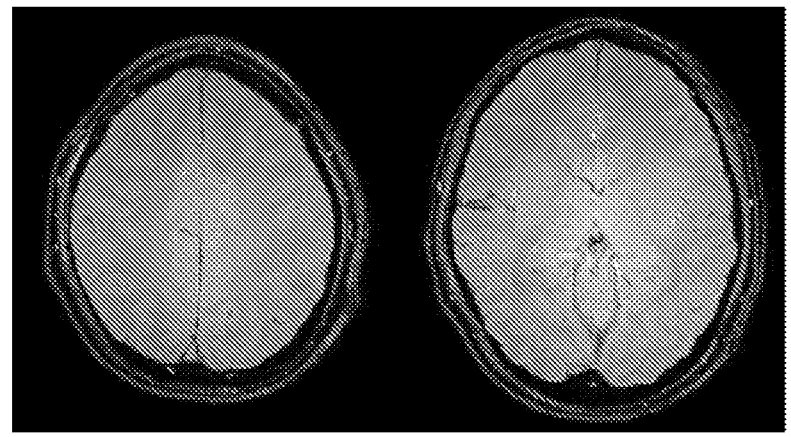
FIG. 4 illustrates the effects of the random phase imparted by a random blipped gradient encoding scheme on images reconstructed from the data to which the phase shifts are imparted.
Figure 4:
Figure 4:
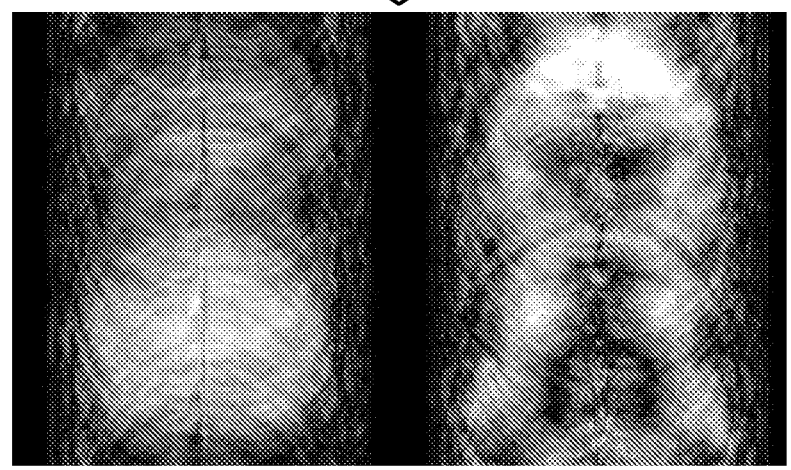
Figure 4:
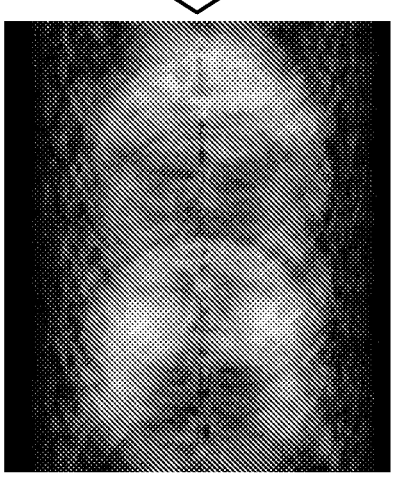

By way of example, when an image is reconstructed from image data simultaneously acquired from n=1 . . . N distinct slice locations, the image will include pixel locations at which signal information is aliased along the slice encoding direction. Thus, the image intensity value for a given pixel location in the reconstructed image includes a superposition of aliased signal information, as illustrated in FIG. 4. The task of "unwrapping" these aliased image pixels can be addressed by a compressed sensing reconstruction framework, such as the one described above.

Figure 5:
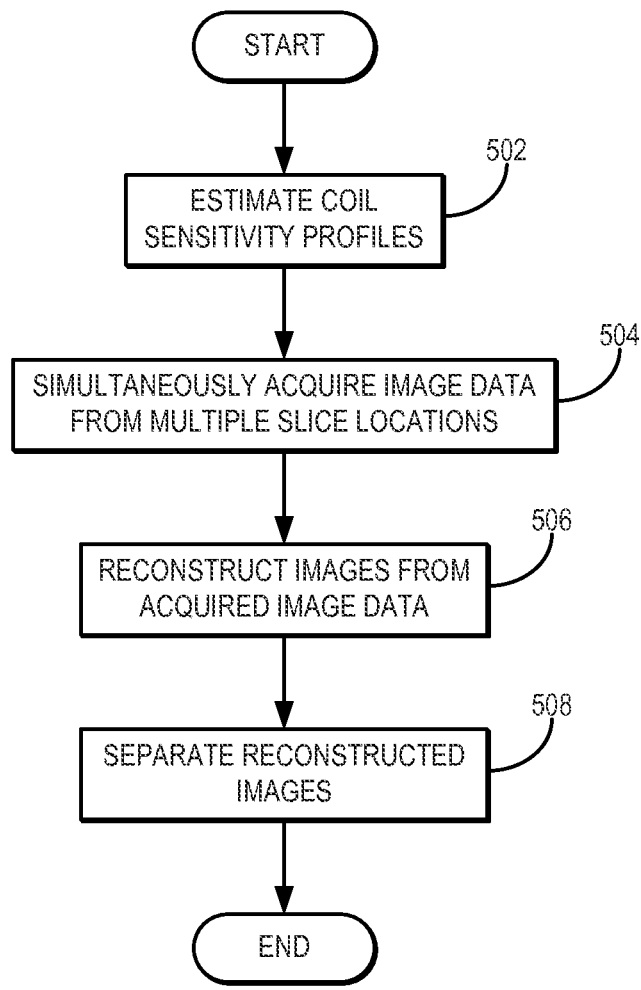
FIG. 5 is a flowchart setting forth the steps of an example of a method for simultaneously acquiring image data from multiple slice locations in a subject and reconstructing images therefrom.

Referring now to FIG. 5, a flowchart setting forth an example of a method for reconstructing a plurality of images from data simultaneously acquired from multiple slice locations is illustrated. In some embodiments where data is acquired using a multichannel receiver, the method may begin with the estimation of a coil sensitivity profile for each receiver coil in the RF coil array employed to acquire data from the subject, as indicated at step 502. It will be appreciated by those skilled in the art that in some instances such coil sensitivity profiles may already be estimated prior to the performance of the method, in which instance step 502 need not be performed. Also, in embodiments where data is acquired using a single receiver channel, step 502 need not be performed. Next, data are simultaneously acquired from multiple slice locations in a subject, as indicated at step 504. This data acquisition is performed by directing the MRI system to perform a pulse sequence that incorporates a random blip gradient encoding scheme, such as those described above. As described above, the acquired data include signal information corresponding to a plurality of slice locations.

Figure 6:
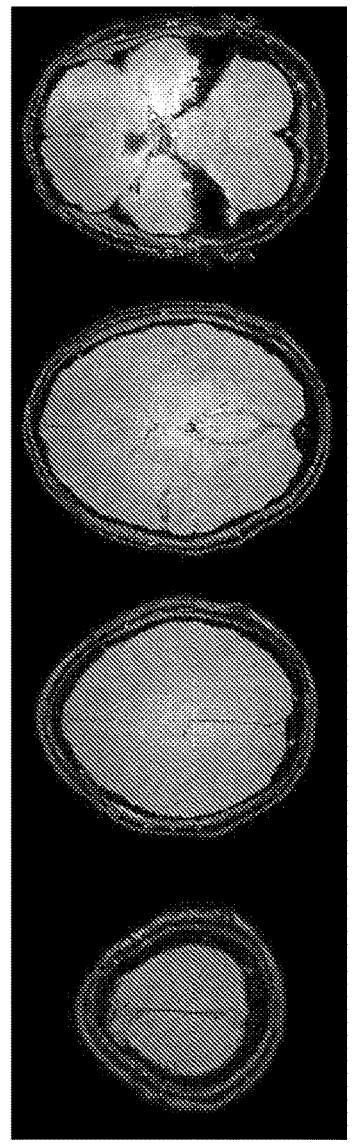
FIG. 6 illustrates an example of images reconstructed from data to which random phase shifts have been imparted using a random blipped gradient encoding scheme.

An image is reconstructed from each data set, as indicated at step 506. Because the acquired data sets include signal information from multiple slice locations that have each been imparted a random phase shift, these reconstructed images include incoherent aliasing along the slice-encoding direction. As illustrated in FIG. 4, this aliasing is exhibited as the superposition of images from the different slice locations in the same image. Each reconstructed image is then processed using the estimated coil sensitivity profiles in order to separate the aliased signal information in order to produce a plurality of separated images of the subject, as indicated at step 508. By way of example, this separation is accomplished using the compressed sensing technique described above. In some embodiments, the compressed sensing technique can additionally include parallel imaging techniques, such as using coil sensitivity profiles in a generalized SENSE framework in addition to the compressed sensing-based constraints. As illustrated in FIG. 6, following this separation distinct images corresponding to distinct image slice locations are produced.

Figure 7:
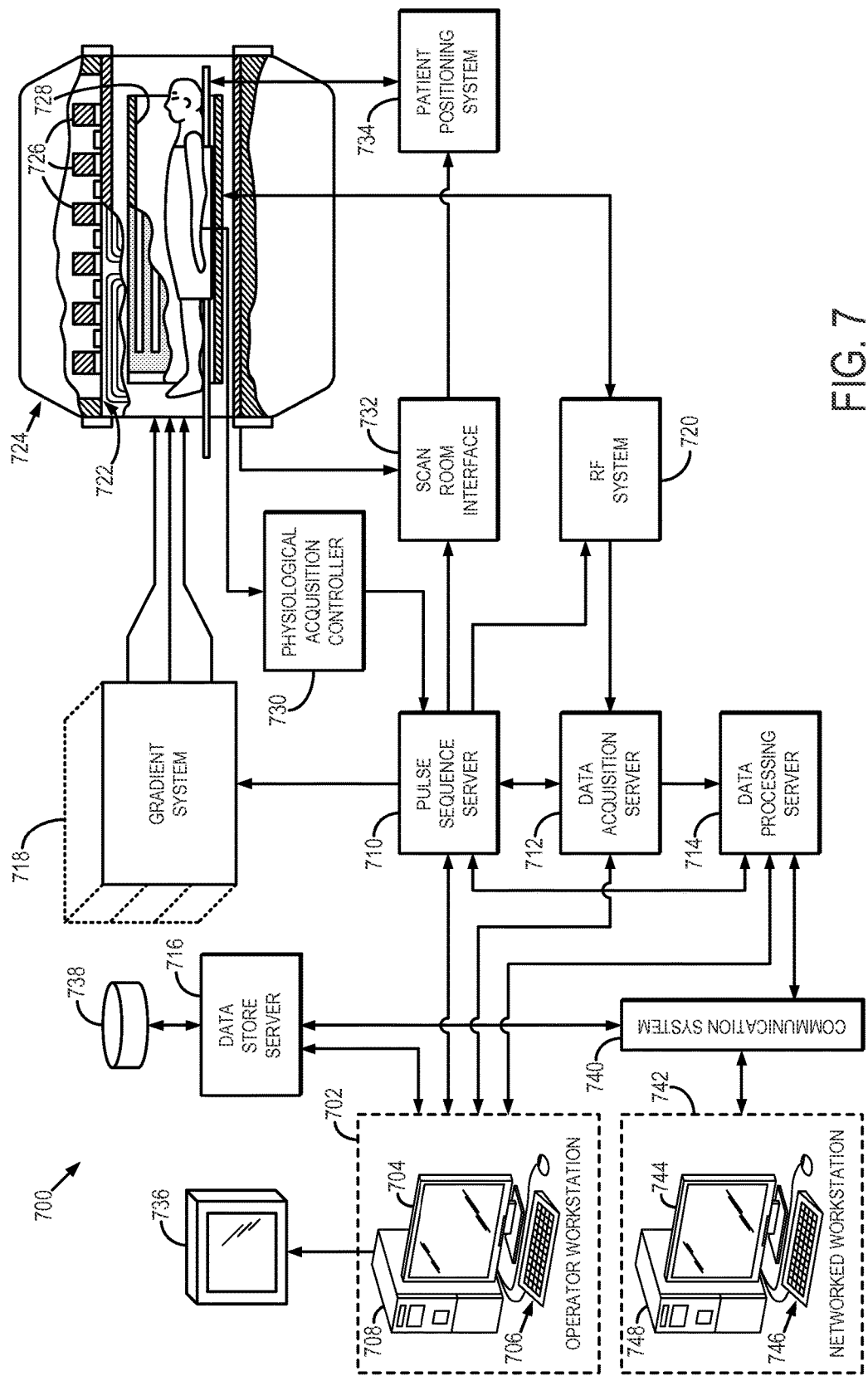
FIG. 7 is a block diagram of an exemplary magnetic resonance imaging ("MRI") system that employs the present invention.

Referring particularly now to FIG. 7, an example of a magnetic resonance imaging ("MRI") system 700 is illustrated. The MRI system 700 includes an operator workstation 702, which will typically include a display 704; one or more input devices 706, such as a keyboard and mouse; and a processor 708. The processor 708 may include a commercially available programmable machine running a commercially available operating system. The operator workstation 702 provides the operator interface that enables scan prescriptions to be entered into the MRI system 700. In general, the operator workstation 702 may be coupled to four servers: a pulse sequence server 710; a data acquisition server 712; a data processing server 714; and a data store server 716. The operator workstation 702 and each server 710, 712, 714, and 716 are connected to communicate with each other. For example, the servers 710, 712, 714, and 716 may be connected via a communication system 740, which may include any suitable network connection, whether wired, wireless, or a combination of both. As an example, the communication system 740 may include both proprietary or dedicated networks, as well as open networks, such as the internet.

The pulse sequence server 710 functions in response to instructions downloaded from the operator workstation 702 to operate a gradient system 718 and a radiofrequency ("RF") system 720. Gradient waveforms necessary to perform the prescribed scan are produced and applied to the gradient system 718, which excites gradient coils in an assembly 722 to produce the magnetic field gradients $G_x$, $G_y$, and $G_z$ used for position encoding magnetic resonance signals. The gradient coil assembly 722 forms part of a magnet assembly 724 that includes a polarizing magnet 726 and a whole-body RF coil 728.

RF waveforms are applied by the RF system 720 to the RF coil 728, or a separate local coil (not shown in FIG. 7), in order to perform the prescribed magnetic resonance pulse sequence. Responsive magnetic resonance signals detected by the RF coil 728, or a separate local coil (not shown in FIG. 7), are received by the RF system 720, where they are amplified, demodulated, filtered, and digitized under direction of commands produced by the pulse sequence server 710. The RF system 720 includes an RF transmitter for producing a wide variety of RF pulses used in MRI pulse sequences. The RF transmitter is responsive to the scan prescription and direction from the pulse sequence server 710 to produce RF pulses of the desired frequency, phase, and pulse amplitude waveform. The generated RF pulses may be applied to the whole-body RF coil 728 or to one or more local coils or coil arrays (not shown in FIG. 7).

The RF system 720 also includes one or more RF receiver channels. Each RF receiver channel includes an RF preamplifier that amplifies the magnetic resonance signal received by the coil 728 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 710 also optionally receives patient data from a physiological acquisition controller 730. By way of example, the physiological acquisition controller 730 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 710 to synchronize, or "gate," the performance of the scan with the subject's heart beat or respiration.

The pulse sequence server 710 also connects to a scan room interface circuit 732 that receives signals from various sensors associated with the condition of the patient and the magnet system. It is also through the scan room interface circuit 732 that a patient positioning system 734 receives commands to move the patient to desired positions during the scan.

The digitized magnetic resonance signal samples produced by the RF system 720 are received by the data acquisition server 712. The data acquisition server 712 operates in response to instructions downloaded from the operator workstation 702 to receive the real-time magnetic resonance data and provide buffer storage, such that no data is lost by data overrun. In some scans, the data acquisition server 712 does little more than pass the acquired magnetic resonance data to the data processor server 714. However, in scans that require information derived from acquired magnetic resonance data to control the further performance of the scan, the data acquisition server 712 is programmed to produce such information and convey it to the pulse sequence server 710. For example, during prescans, magnetic resonance data is acquired and used to calibrate the pulse sequence performed by the pulse sequence server 710. As another example, navigator signals may be acquired and used to adjust the operating parameters of the RF system 720 or the gradient system 718, or to control the view order in which k-space is sampled. In still another example, the data acquisition server 712 may also be employed to process magnetic resonance signals used to detect the arrival of a contrast agent in a magnetic resonance angiography ("MRA") scan. By way of example, the data acquisition server 712 acquires magnetic resonance data and processes it in real-time to produce information that is used to control the scan.

The data processing server 714 receives magnetic resonance data from the data acquisition server 712 and processes it in accordance with instructions downloaded from the operator workstation 702. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 714 are conveyed back to the operator workstation 702 where they are stored. Real-time images are stored in a data base memory cache (not shown in FIG. 7), from which they may be output to operator display 712 or a display 736 that is located near the magnet assembly 724 for use by attending physicians. Batch mode images or selected real time images are stored in a host database on disc storage 738. When such images have been reconstructed and transferred to storage, the data processing server 714 notifies the data store server 716 on the operator workstation 702. The operator workstation 702 may be used by an operator to archive the images, produce films, or send the images via a network to other facilities.

The MRI system 700 may also include one or more networked workstations 742. By way of example, a networked workstation 742 may include a display 744; one or more input devices 746, such as a keyboard and mouse; and a processor 748. The networked workstation 742 may be located within the same facility as the operator workstation 702, or in a different facility, such as a different healthcare institution or clinic.

The networked workstation 742, whether within the same facility or in a different facility as the operator workstation 702, may gain remote access to the data processing server 714 or data store server 716 via the communication system 740. Accordingly, multiple networked workstations 742 may have access to the data processing server 714 and the data store server 716. In this manner, magnetic resonance data, reconstructed images, or other data may exchanged between the data processing server 714 or the data store server 716 and the networked workstations 742, such that the data or images may be remotely processed by a networked workstation 742. This data may be exchanged in any suitable format, such as in accordance with the transmission control protocol ("TCP"), the internet protocol ("IP"), or other known or suitable protocols.

Figure 8:
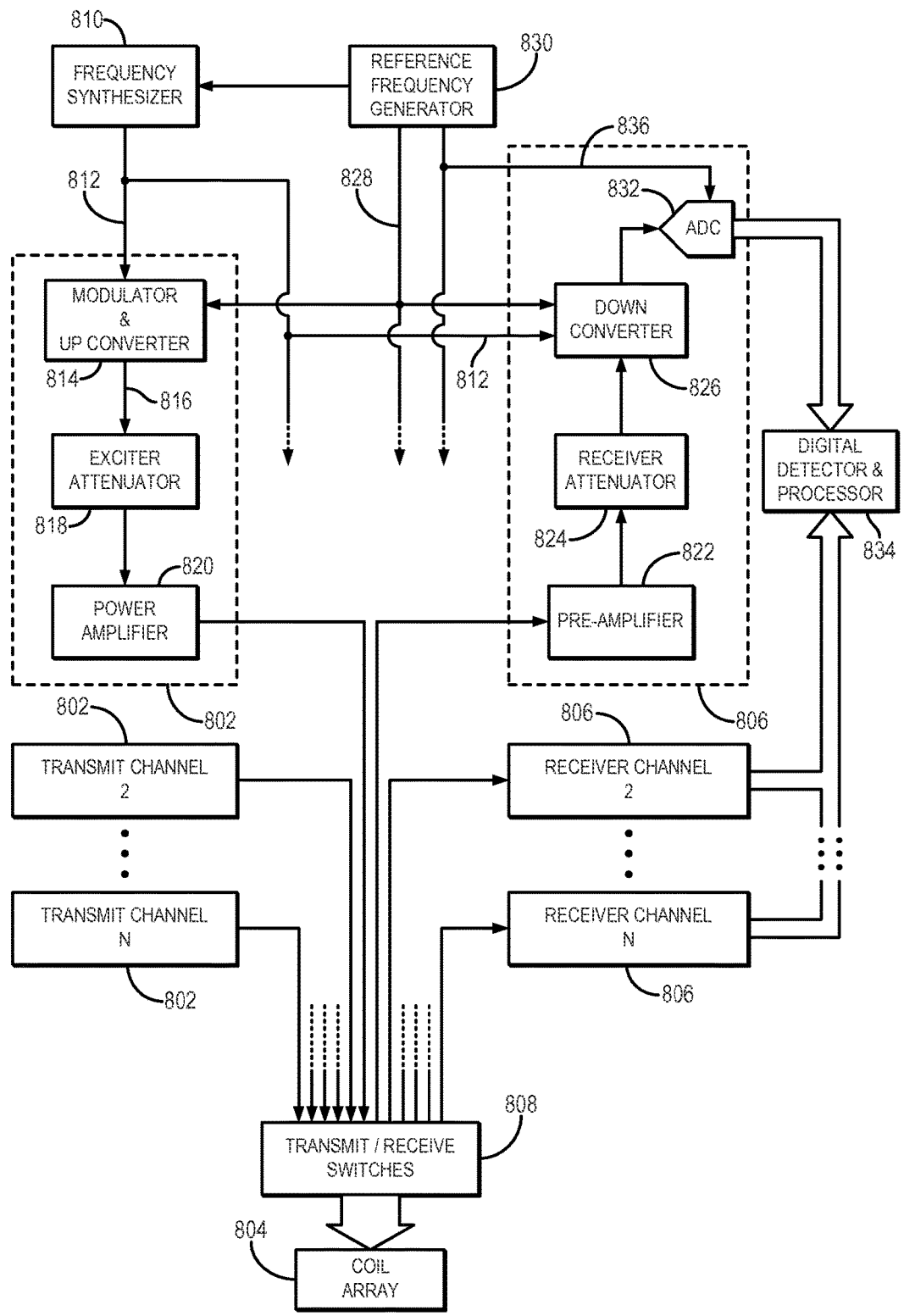
FIG. 8 is a block diagram of an exemplary radio frequency ("RF") system that forms part of the MRI system of FIG. 7.

As shown in FIG. 7, the radiofrequency ("RF") system 720 may be connected to the whole body RF coil 728, or, as shown in FIG. 8, a transmission section of the RF system 720 may connect to one or more transmit channels 802 of an RF coil array 804 and a receiver section of the RF system 720 may connect to one or more receiver channels 806 of the RF coil array 804. The transmit channels 802 and the receiver channels 806 are connected to the RF coil array 804 by way of one or more transmit/receive ("T/R") switches 808. The receiver channel 806 may also be an assembly of coils separate from the transmit coil array. In such a configuration, the T/R switches 808 are not needed. The transmit coil elements are detuned or otherwise rendered dysfunctional during the receive operation, and the receiver coil elements are similarly detuned or otherwise rendered dysfunctional during operation of the transmit coils. Such detuning may be accomplished with appropriate control logic signals.

Referring particularly to FIG. 8, the RF system 720 includes one or more transmit channels 802 that produce a prescribed RF electromagnetic field. The base, or carrier, frequency of this RF field is produced under control of a frequency synthesizer 810 that receives a set of digital signals from the pulse sequence server 710. These digital signals indicate the frequency, amplitude, and phase of the RF carrier signal produced at an output 812. The RF carrier is applied to a modulator and, if necessary, an up converter 814 where its amplitude and phase is modulated in response to a signal, R(t), also received from the pulse sequence server 710. The signal, R(t), defines the envelope of the RF pulse to be produced and is produced by sequentially reading out a series of stored digital values. These stored digital values may be changed to enable any desired RF pulse envelope to be produced.

The magnitude of the RF pulse produced at output 816 is attenuated by an attenuator circuit 818 that receives a digital command from the pulse sequence server 710. The phase of the RF pulse may also be altered using phase shifters (not shown). The modulated RF pulses are then applied to a power amplifier 820 that drives one element of the RF coil array 804, or several such elements that are electrically coupled. Multiple transmit channels then drive other elements of the multichannel transmit coil array.

The MR signal produced by the subject is picked up by the RF coil array 804 and applied to the inputs of the set of receiver channels 806. A preamplifier 822 in each receiver channel 806 amplifies the signal, which is then attenuated, if necessary, by a receiver attenuator 824 by an amount determined by a digital attenuation signal received from the pulse sequence server 710. The received signal is at or around the Larmor frequency, and this high frequency signal may be down converted in a two step process by a down converter 826. In an example of such a process, the down converter 826 first mixes the MR signal with the carrier signal on line 812 and then mixes the resulting difference signal with a reference signal on line 828 that is produced by a reference frequency generator 830. The MR signal is applied to the input of an analog-to-digital ("A/D") converter 832 that samples and digitizes the analog signal. As an alternative to down conversion of the high frequency signal, the received analog signal can also be detected directly with an appropriately fast analog-to-digital ("A/D") converter and/or with appropriate undersampling. The sampled and digitized signal may then be applied to a digital detector and signal processor 834 that produces in-phase (I) and quadrature (Q) values corresponding to the received signal. The resulting stream of digitized I and Q values of the received signal are output to the data acquisition server 712. In addition to generating the reference signal on line 828, the reference frequency generator 830 also generates a sampling signal on line 836 that is applied to the A/D converter 832.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a plurality of images of a subject with a magnetic resonance imaging (MRI) system, the steps of the method comprising:
    a) directing an MRI system to perform a pulse sequence comprising:
        applying a radio frequency (RF) excitation field to a portion of a subject that includes a plurality of slice locations, the plurality of slice locations including a current slice location and at least one adjacent slice location, the RF excitation field exciting spins in the plurality of slice locations;
        establishing at least one readout magnetic field gradient along a frequency-encoding direction following the application of the RF excitation field in order to form echo signals;
        sequentially producing a plurality of slice-encoding magnetic field gradient blips along a slice-encoding direction while the at least one readout magnetic field gradient is established, each sequential slice-encoding magnetic field gradient blip having a randomly assigned magnitude such that a random phase shift related to the randomly assigned magnitude is imparted to the formed echo signals;
    b) acquiring data with an array of RF receiver coils by sampling the formed echo signals; and
    c) reconstructing at least one image for each of the plurality of slice locations from the data acquired in step b).

2. The method as recited in claim 1, further comprising estimating a sensitivity map for each RF receiver coil in the array of RF receiver coils.

3. The method as recited in claim 2, wherein step c) further includes reconstructing each of the at least one images using the estimated sensitivity map.

4. The method as recited in claim 3, wherein step c) includes reconstructing each of the at least one images using a compressed sensing framework that accounts for the random phase shifts imparted to the formed echo signals.

5. The method as recited in claim 4, wherein step c) includes forming a forward matrix that includes the estimated sensitivity maps and information about the random phase shifts, the forward matrix being used in the compressed sensing framework to reconstruct each of the at least one images.

6. The method as recited in claim 1, wherein step a) further includes directing the MRI system to apply a phase encoding magnetic field gradient substantially contemporaneously with each slice-encoding magnetic field gradient blip such that the formed echo signals are spatially encoded along a phase-encode direction.

7. A method for directing a magnetic resonance imaging (MRI) system to sample k-space, the steps of the method comprising:
    a) directing the MRI system to apply a radio frequency pulse in the presence of a spatially selective magnetic field gradient pulse, such that transverse magnetization is established in a spatial region including at least two slice locations;
    b) directing the MRI system to apply an alternating readout magnetic field gradient along a frequency encoding direction, such that a plurality of echo signals are formed;
    c) directing the MRI system to apply a sequence of slice-encoding magnetic field gradient blips, each slice-encoding magnetic field gradient blip having a randomly assigned magnitude such that a random phase is imparted to the echo signals formed in step b); and
    d) directing the MRI system to acquire k-space data from the plurality of formed echo signals using an array of RF receiver coils.

8. The method as recited in claim 7, further comprising applying a phase encoding magnetic field gradient substantially contemporaneously with the repeatedly applied set of slice encoding magnetic field gradient blips such that the plurality of echo signals are spatially encoded along a phase-encode direction.

9. The method as recited in claim 8, wherein the phase encoding magnetic field gradient includes a plurality of phase encoding magnetic field gradient blips, each of the plurality of phase encoding magnetic field gradient blips being played out substantially contemporaneously with a respective slice encoding magnetic field gradient blip.

10. The method as recited in claim 7, further comprising reconstructing at least two images from the acquired k-space data, each of the at least two images depicting a respective one of the at least two slice locations.

11. The method as recited in claim 10, further comprising estimating a sensitivity map for each RF receiver coil in the array of RF receiver coils and using the estimated sensitivity maps when reconstructing the at least two images.

\* \* \* \* \*

UNITED STATES PATENT AND TRADEMARK OFFICE
CERTIFICATE OF CORRECTION

PATENT NO. : 10,436,866 B2  
APPLICATION NO. : 15/114999  
DATED : October 8, 2019  
INVENTOR(S) : Berkin Bilgic et al.

Page 1 of 1

It is certified that error appears in the above-identified patent and that said Letters Patent is hereby corrected as shown below:

In the Specification

Column 3, Line 55, "$\{+\pi, -\pi, +\pi C, -\pi, +\pi ...\}$" should be --$\{+\pi, -\pi, +\pi, -\pi, +\pi ...\}$--.

Signed and Sealed this  
Twelfth Day of November, 2019

Andrei Iancu  
*Director of the United States Patent and Trademark Office*